United States Patent
Iwanczyk et al.

(10) Patent No.: US 6,713,768 B2
(45) Date of Patent: Mar. 30, 2004

(54) JUNCTION-SIDE ILLUMINATED SILICON DETECTOR ARRAYS

(75) Inventors: Jan S. Iwanczyk, Los Angeles, CA (US); Bradley E. Patt, Sherman Oaks, CA (US); Carolyn Tull, Orinda, CA (US)

(73) Assignee: Photon Imaging, Inc., Northridge, CA (US)

( * ) Notice: Subject to any disclaimer, the term of this patent is extended or adjusted under 35 U.S.C. 154(b) by 0 days.

(21) Appl. No.: 09/835,937

(22) Filed: Apr. 16, 2001

(65) Prior Publication Data

US 2002/0148967 A1 Oct. 17, 2002

(51) Int. Cl.⁷ .................................................. G01T 1/24
(52) U.S. Cl. ............................ 250/370.11; 250/370.14; 257/438
(58) Field of Search ....................... 250/370.11, 370.14, 250/370.09; 257/186, 196, 438

(56) References Cited

U.S. PATENT DOCUMENTS

| | | | | |
|---|---|---|---|---|
| 5,021,854 A | * | 6/1991 | Huth | ........................... 257/438 |
| 5,757,057 A | * | 5/1998 | Dabrowski | .................. 257/438 |
| 5,773,829 A | | 6/1998 | Iwanczyk et al. | |
| 6,025,585 A | | 2/2000 | Holland | |
| 6,172,370 B1 | * | 1/2001 | Liao et al. | ............. 250/370.09 |

OTHER PUBLICATIONS

Holland, S.E., et al., "Development of Low Noise, BackSide Illuminated Silicon Photodiode Arrays," IEEE Transactions on Nuclear Science, vol. 44, No. 3, pp. 443–447, Jun. 1997.

* cited by examiner

*Primary Examiner*—Constantine Hannaher
(74) *Attorney, Agent, or Firm*—Christie, Parker & Hale, LLP

(57) ABSTRACT

A junction-side illuminated detector array of pixelated detectors is constructed on a silicon wafer. A junction contact on the front-side may cover the whole detector array, and may be used as an entrance window for light, x-ray, gamma ray and/or other particles. The back-side has an array of individual ohmic contact pixels. Each of the ohmic contact pixels on the back-side may be surrounded by a grid or a ring of junction separation implants. Effective pixel size may be changed by separately biasing different sections of the grid. A scintillator may be coupled directly to the entrance window while readout electronics may be coupled directly to the ohmic contact pixels. The detector array may be used as a radiation hardened detector for high-energy physics research or as avalanche imaging arrays.

27 Claims, 7 Drawing Sheets

JUNCTION-SIDE ILLUMINATED SILICON DETECTOR ARRAYS

STATEMENT REGARDING FEDERALLY SPONSORED RESEARCH OR DEVELOPMENT

This invention was made with government support under Small Business Innovation Research program (Grant # DE-FG03-99ER82854) awarded by the Department of Energy. The Government has certain rights in this invention.

FIELD OF THE INVENTION

The present invention relates to radiation detectors and more specifically, to a structure of and a method for fabricating pixelated silicon detector arrays and photodetector arrays.

BACKGROUND OF THE INVENTION

Many applications can benefit from a development of advanced pixelated silicon detector arrays with superior characteristics for dark leakage current, quantum efficiency, and production yields. One such application involves silicon photodetector arrays that can be used to construct gamma-ray cameras with very high resolution.

Highly pixelated silicon photodetector arrays coupled to closely matched parallel piped CsI(Tl) scintillator arrays are a known basis for solid state gamma-ray cameras capable of imaging a wide variety of subjects ranging from small animals in the laboratory to whole human bodies. One example of silicon photodetector arrays for radiation imaging is disclosed in U.S. Pat. No. 5,773,829 entitled "Radiation Imaging Detector," issued Jun. 30, 1998 to Iwanczyk and Patt, which is hereby incorporated by reference in full.

Large-sized solid state gamma-ray cameras employing such radiation imaging detectors typically require low cost and high-yield semiconductor photodetector array structures with superior performance and competitive prices compared to those of the existing clinical systems for Single Photon Emission Computed Tomography (SPECT) which utilize known vacuum Photomultiplier Tube (PMT) technologies.

Other broad applications including radiation hardened detector arrays for high-energy physics research would also benefit from a development of low cost, high-yield detector array structures.

Typical silicon photodiode arrays with parallel signal readout are based on (p+)–(n)–(n+) structures constructed on high resistivity (1–100 ohm-m) silicon wafers. P+ contacts forming junctions in the n-type substrate are constructed in the form of a diode array. A common n+ contact forms an ohmic contact, and is used as an entrance window (light sensitive window).

Structures wherein the n+ (ohmic) contact is used as the entrance window for light, x-rays, gamma rays, or particles, and in which the p+ (junction) contacts are used as the readout are referred to as back-side illuminated photodiodes or back-illuminated photodiodes, the junction-side commonly being referred to as the front-side. Such back-side illuminated diode arrays are known, and are described in a paper entitled "Development of Low Noise, Back-Side Illuminated Silicon Photodiode Arrays," by S. E. Holland, N. W. Wang, and W. W. Moses published in IEEE Transactions on Nuclear Science Vol.44 No.3 1997.

In the back-side illuminated photodiodes, the (p+)–(n) junction array, which is created on the non-light sensitive side of the chip, is generally used only for signal readout and therefore can usually be bonded directly to the readout chip or circuitry without obstructing the light from a scintillator. The opposite side (ohmic side) is typically coupled to the scintillator for light detection. This type of array typically operates only in fully depleted mode, which usually requires reverse bias of more than 70 V for the standard 50 ohm-m resistivity silicon or higher biases for lower resistivity material.

In order to achieve stable I-V characteristic and a low reverse current value, each of the p+ pixels typically incorporates a field plate and surrounding guard rings to optimize the potential distribution around the pixel and to drain out the surface leakage current. These structures typically suffer from the following shortcomings:

1. The requirement of high light sensitivity at the ohmic contact conflicts with the technological requirements for effective gettering of the bulk material necessary for maintaining long life times of minority carriers. For effective gettering of the detector bulk, high concentrations of phosphorus dopant and a relatively large thickness of doped material is required in the n+ contact. On the other hand, in order to ensure high light sensitivity, the contact has to be made as thin as possible with an optimized doping profile. Thinning of the contact is at the cost of the gettering process, and it usually causes an increase in the dark leakage current in the constructed arrays;
2. In the known back-side illuminated structures, in order to achieve full depletion at low bias voltages and to reduce the bulk generation current component, designers favor the use of very thin wafers. However, this creates technological problems due to the lack of mechanical strength of the thin silicon material;
3. Reduction of the surface leakage current is usually achieved by constructing a field plate structure at the periphery of individual pixels. However, this is known to lead to generation of defects at the interface between $SiO_2$ and Si in the field plate. These defects typically are a source of excess reverse current. Some reduction of the defect density can usually be achieved by use of costly high purity processes and materials;
4. For low leakage operation, the back-side illuminated structures generally require guard ring structures typically surrounding each individual pixel, and at least surrounding small groups (32 to 64) of pixels. These guard ring structures require additional physical space between the pixels and create problems in building high-density arrays or mosaics of such arrays.

SUMMARY OF THE INVENTION

In one embodiment according to the present invention, detector array is formed on a semiconductor material having a first side and a second side. The detector array includes an entrance window formed on the first side. The entrance window is used to receive radiation. The detector array also includes an array of detectors formed on the second side. One or more of the detectors are used for detecting the radiation received via the entrance window. The entrance window forms a junction with the semiconductor material, and the detectors include pixelated ohmic contacts.

In another embodiment according to the present invention, a method of forming a detector array on a semiconductor material having a first side and a second side is provided. An entrance window is formed on the first side. The entrance window is used for receiving radiation. An array of detectors is formed on the second side. One or more of the detectors are used for detecting the radiation received via the entrance window. The entrance window forms a junction with the semiconductor material, and the detectors include pixelated ohmic contacts.

In yet another embodiment of the present invention, a composite detector array includes multiple detector arrays.

In still another embodiment of the present invention, a detector array is formed on a semiconductor material having a first side and a second side. The detector array includes entrance window means formed on the first side. The entrance window means is used for receiving radiation. The detector array also includes an array of detector means formed on the second side. One or more of the detector means are used for detecting the radiation received via the entrance window means. The entrance window means form a junction with the semiconductor material, and the detector means include pixelated ohmic contacts.

BRIEF DESCRIPTION OF THE DRAWINGS

The above and other features of the present invention may be more fully understood from the following detailed description, taken together with the accompanying drawings, wherein similar reference characters refer to similar elements throughout and in which.

DETAILED DESCRIPTION

Figure 1:
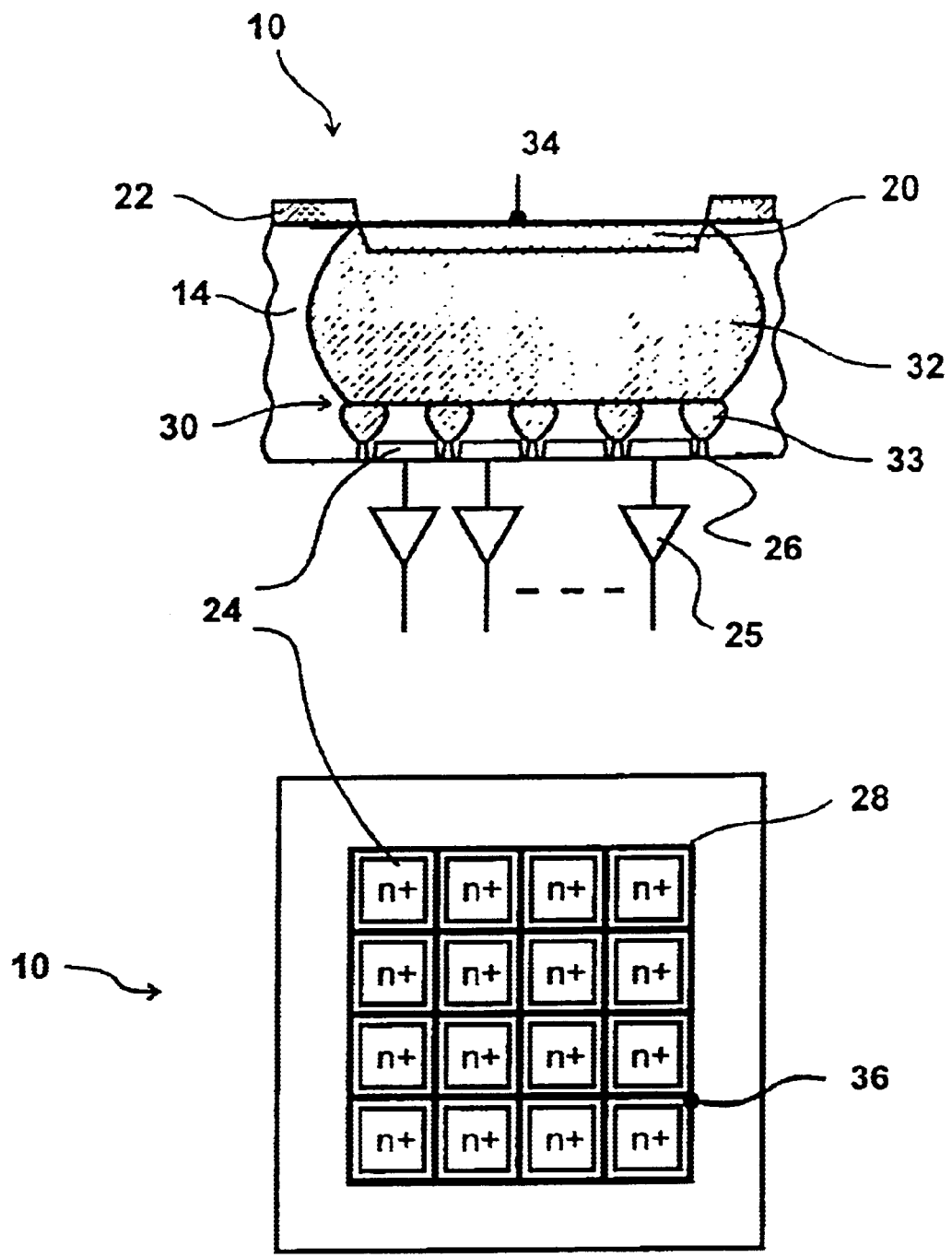
FIG. 1 is a cross-sectional view of a detector array produced from high resistivity n-type Si (top) and back-side view (bottom) in an embodiment according to the present invention.

In one embodiment of the present invention, a new junction-side illuminated silicon detector array of pixelated silicon detectors and a method of constructing the same are disclosed. The detectors may be constructed from high resistivity silicon (Si) with a common junction contact on the front-side and ohmic contacts implemented as a pixelated array on the back-side.

In the present invention, the junction contact preferably covers the entire detector array and serves as a front-side light, x-ray, gamma ray and/or particle sensitive window without dead areas. To isolate the individual ohmic contact pixels on the back-side, the inter-pixel gaps preferably contain junction separation implants that surround each pixel in the form of a grid or rings created on the entire array.

In this way, the light entrance contact of the present invention may be improved in terms of depth and profile for better light sensitivity.

The entrance window of the present invention preferably allows for better gettering of the bulk material than in the back-side illuminated method, thus allowing for reduction of bulk generated current. In addition, the operational bias of the present invention may be up to four times lower than required for the traditional back-side illuminated structures. Using the structure in an embodiment according to the present invention, the field plates may be eliminated, resulting in decrease of the excess current, and the guard-ring structures may be eliminated, reducing the gap between pixels, and thus allowing for construction of high-density arrays.

The photodetector array construction of the present invention may have significant advantages in the mass production process due to lower operating bias voltages, significantly simplified testing, use of thicker Si wafers (less breakage during processing), and possible very high production yields. Use of thicker wafers opens up additional possibilities of processing 6" (instead of 4") (approximately 15 cm (instead of approximately 10 cm)) or even larger diameter wafers leading to the possibility of further reduction in production costs.

The photodetector arrays of the present invention may have one or more of the following advantages over the conventional devices:

1) The light entrance contact may be formed by boron implantation or other doping methods such as diffusion of deposited dopants and may be improved in terms of depth and profile for better light sensitivity;
2) The technology of photosensitive contacts does not interfere substantially with the requirements of the improved gettering of the bulk material that allows reduction of the bulk generated current;
3) The operational bias may be up to four times lower than required for the traditional back-side illuminated structures;
4) The field plates, the guard ring structures, and associated excess current may be eliminated;
5) Construction of pixels without using guard rings may allow reducing the gap between pixels and may make the high-density arrays feasible;
6) Testing of the proposed structures may be significantly simplified compared to the traditional designs; and
7) The lower bias voltages combined with simpler and more optimized technology may lead to the significant improvement in production yields.

The detector array of the present invention may also be used as a radiation hardened detector for high-energy physics research for detection of particles, x-ray, or gamma rays. The radiation hardness of this structure may be achieved through simplified construction (lack of the field plates and excessive guard rings) and relatively low operating bias voltages. The present invention may also find other broad applications.

The signals may be coupled from the pixelated ohmic contacts in the present invention to the readout electronics. Because the readout is done on the opposite side of the entrance window on the silicon wafer, it is possible to couple the device to a scintillator, a scintillator array, a light guide or a diffuser placed directly on the entrance window without interfering with the connections to the readout electronics.

Current silicon processing equipment for this technology usually limits the size of a detector wafer to approximately 10 cm to 20 cm in diameter. In order to make a detector with larger dimensions, it typically is necessary to create modules on the wafers and cut them out for further assembly. The individual modules can then be tiled together into larger arrays. The basic structures according to the present invention may be built in form of modules with a minimum dead space at the edges.

Detector arrays of the present invention may be coupled to CsI(Tl) scintillator arrays in various manners to achieve a seamless boundary between modules. One method may include making smaller photodetector pixels at the detector periphery to compensate for the excess material outside of the active part of the device. The scintillator pixels maintain a uniform size and pitch across boundaries of the photodetector modules. Another method may include sharing of light from common scintillation pixels.

The detector array (e.g., at an entrance window) may be directly coupled with the CsI(Tl) scintillator. The detector array may also be coupled with the CsI(Tl) scintillator via an interface that functions as a light guide between the entrance window and the CsI(Tl) scintillator. The interface may include a diffuser to spread the light coming out of the scintillator and may comprise glass, plastic, gel, grease and/or any other suitable material. The interface may also be used to perform index of refraction matching between the silicon detector (or silicon oxide or other entrance material on the detector) and the scintillator. It may further be used to match non-flat surfaces of the scintillator and the entrance window.

The low cost and high yields of the structures in embodiments according to the present invention coupled to CsI(Tl) scintillating crystals may allow for construction of large-sized solid state gamma cameras and systems for Single Photon Emission Computed Tomography (SPECT) with superior performance and low cost.

Referring now to the drawings and in particular to FIG. 1, a light sensitive array 10 in an embodiment according to the present invention is constructed from n-type silicon (Si) 14. The n-type Si 14 preferably is high resistivity Si, such resistivity preferably being between 10 ohm-m to 200 ohm-m. The light sensitive array 10 has a common p$^+$ light sensitive contact 20 on the front-side and ohmic contacts implemented as a n$^+$ pixelated array 24 on the back-side. The n$^+$ pixels on the back-side preferably are coupled to readout electronics 25 via pre-amplifiers (not shown).

The p$^+$ light sensitive contact preferably covers the entire light sensitive array 10 and serves as a light sensitive window with substantially no dead areas. The p$^+$ light sensitive contact 20 may also be referred to as an entrance window contact or as an entrance window. An electrically insulating layer 22, which may include SiO$_2$, surrounds the entrance window on the front-side of the light sensitive array 10.

To isolate the individual n$^+$ pixels 24, the inter-pixel gap contains p$^+$ separation implants 26 that surround each pixel in the form of a p$^+$ grid 28 created on the entire array. In other embodiments, the p$^+$ implants may form a number of p+ rings to isolate the individual n$^+$ pixels 24. The p+ grid or the p+ rings may be created on separate parts of the array, which may then be connected together externally, or they may be placed directly on the entire silicon array.

A reverse bias preferably is applied between the n$^+$ pixels 24 and the p$^+$ light sensitive contact 20 and between the n$^+$ pixels 24 and the p$^+$ grid 28. The value of an operational bias voltage $-V_B$ 34 applied to the p$^+$ light sensitive contact 20 and the grid voltage $-V_G$ 36 applied to the p$^+$ grid 28 may be different and should ensure pinch off 30 between a front depleted region 32 extending from the front contact toward the bulk of the substrate and a pixel depleted region 33 extending from the pixels towards the bulk material. For example, $V_G$ may range from $-1$ to $-10$ V (depending on substrate resistivity) and $V_B$ may range from $-10$ to $-200$ V (depending on substrate resistivity and thickness). The pinch off 30 between these two depleted regions is a condition for proper pixel isolation. Before the pinch off occurs, the light sensitive array 10 operates as a single photodiode.

The operational bias voltage, $-V_B$ 34 applied to the p$^+$ light sensitive contact 20 may be lower by up to a factor of four than the bias voltage necessary to operate standard back-side illuminated silicon structures fabricated from identical starting materials. During testing of the light sensitive array 10, it is not required to measure each of the (thousands of) individual pixels at a great expenditure of time and resources. Instead, a complete evaluation of the array may be achieved with only two measurements. The first measurement is of the leakage current of the fully biased p$^+$ light sensitive contact 20 (without biasing the p$^+$ grid 28). The second measurement is of the leakage current of the fully biased p$^+$ grid 28 (without biasing the p$^+$ light sensitive contact 20). Measured values of the leakage currents less than 100 $\mu$A/m$^2$ for the p$^+$ light sensitive contact 20 and p$^+$ grid 28 may be an indication of the proper operation of the entire light sensitive array 10. Leakage currents as low as 1 $\mu$A/m$^2$ may be encountered during these measurements.

Figure 2:
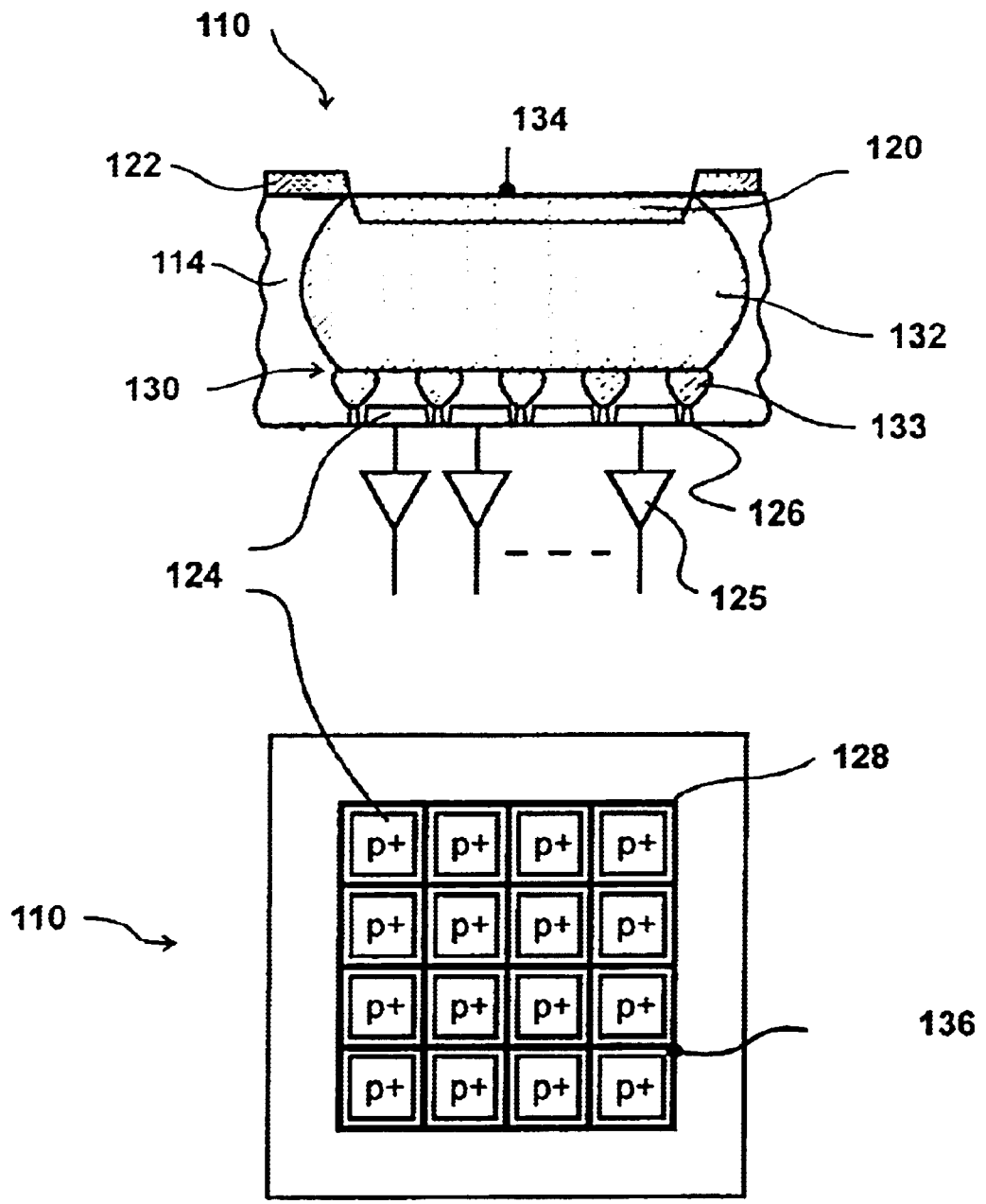
FIG. 2 is a cross-sectional view of a detector array produced from high resistivity p-type Si (top) and back-side view (bottom) in an embodiment according to the present invention.

FIG. 2 is a block diagram of a light sensitive array 100 in another embodiment according to the present invention. The light sensitive array 110 is constructed from p-type Si 114. The p-type Si 114 preferably is high resistivity Si. The light sensitive array 110 has a common n$^+$ light sensitive contact 120 on the front-side and ohmic contacts implemented as a p$^+$ pixelated array 124 on the back-side. The P$^+$ pixels on the back-side preferably are coupled to readout electronics via pre-amplifiers (not shown).

The n$^+$ light sensitive contact 120 preferably covers the entire light sensitive array 110 and serves as a light sensitive window without dead areas. The n$^+$ light sensitive contact 120 may also be referred to as an entrance window contact or as an entrance window. An electrically insulating layer 122, which may include SiO$_2$, surrounds the entrance window on the front-side of the light sensitive array 10.

To isolate the individual p$^+$ pixels 124, the inter-pixel gap contains n$^+$ separation implants 126 that surround each pixel in the form of an n$^+$ grid 128 created on the entire array. In other embodiments, the n$^+$ implants may form a number of n$^+$ rings to isolate the individual p$^+$ pixels 124. The n$^+$ grid or the n$^+$ rings may be created on separate parts of the array, which may then be connected together externally, or they may be placed directly on the entire silicon array.

A reverse bias preferably is applied between the p$^+$ pixels 124 and the n$^+$ light sensitive contact 120 and between the p$^+$ pixels 124 and the n$^+$ grid 128. The value of an operational bias voltage $+V_B$ 134 applied to the n$^+$ light sensitive contact 120 and the voltage $+V_G$ 136 applied to the n$^+$ grid 128 may be different and should ensure pinch off 130 between front and pixel depleted regions 132 and 133. The pinch off 130 between these two depleted regions is a condition for proper pixel isolation. Before the pinch off occurs, the light sensitive array 110 operates as a single photodiode.

The operational bias voltage, $+V_B$ 134 applied to the n$^+$ light sensitive contact 120 may be lower by up to a factor of four than the bias voltage necessary to operate standard back-side illuminated silicon structures fabricated from identical starting materials. During testing of the light sensitive array 110, it is not required to measure each of the (thousands of) individual pixels at a great expenditure of time and resources. Instead, a complete evaluation of the array may be achieved with only two measurements. The first measurement is of the leakage current of the fully biased $n^+$ light sensitive contact 120 (without biasing the $n^+$ grid 128). The second measurement is of the leakage current of the fully biased $n^+$ grid 128 (without biasing the $n^+$ light sensitive contact 120). Measured values of the leakage currents less than 100 $\mu A/m^2$ for the $n^+$ light sensitive contact 120 and $n^+$ grid 128 may be an indication of the proper operation of the entire light sensitive array 110. Leakage currents as low as 1 $\mu A/m^2$ may be encountered during these measurements.

Figure 3:
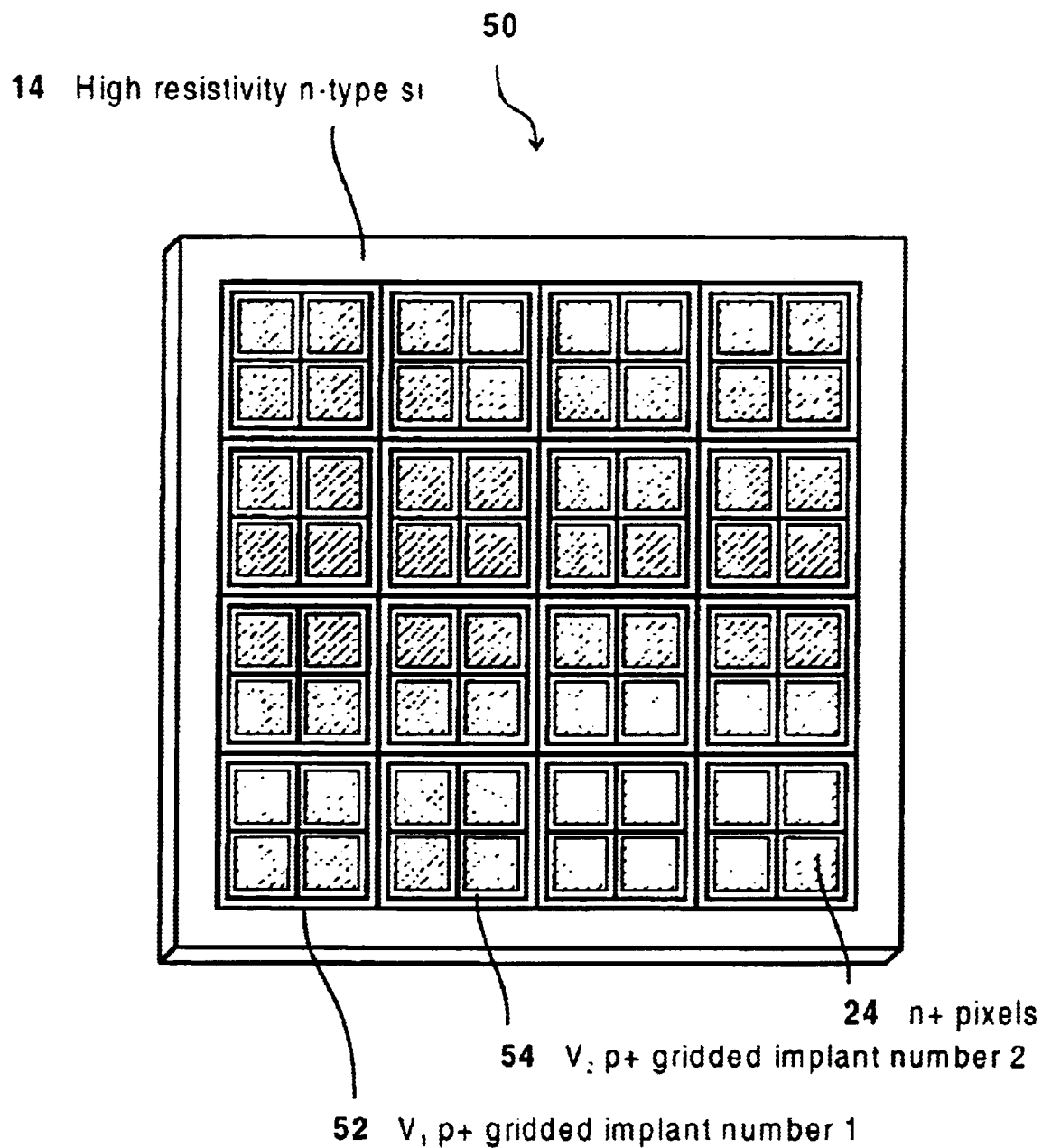
FIG. 3 is a top view of the topology of a detector array showing separate grids for changing of the pixel sizes by biasing appropriate grids in an embodiment according to the present invention.

FIG. 3 shows a construction of a grid pattern where high resistivity n-type Si 14 is used as the starting material. The readout side of a device 50 in this case includes at least two grid patterns. One of the grid patterns 52 surrounds a second (interior) set of grid patterns 54. In this case, it is possible to achieve one pixel size by biasing the exterior sections of the grid 52 using voltage $V_1$, and to change the size of the pixels by biasing the interior sections of the grid 54 using voltage $V_2$. Using this method, the pixel size and the resulting spatial resolution of the detector array may be electronically regulated.

Figure 4:
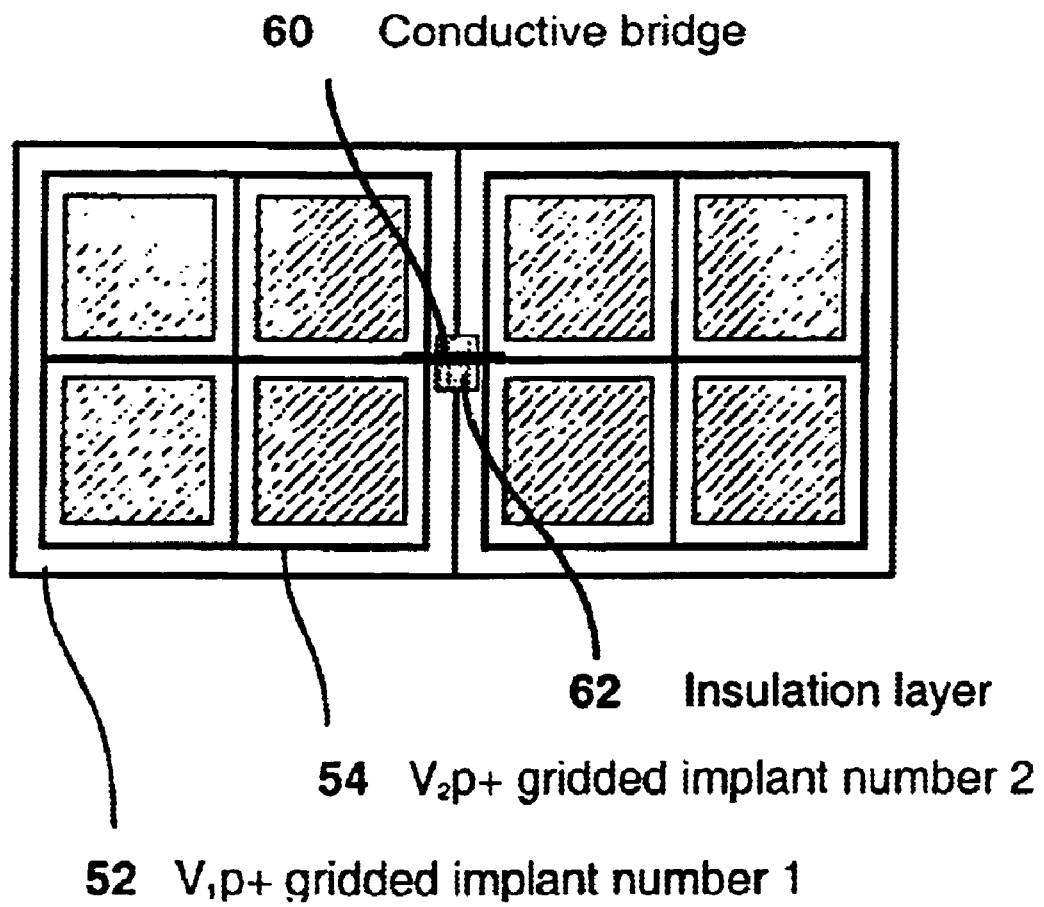
FIG. 4 is a top view illustrating the method for joint biasing of individual grid arrangements by coupling grids together.
Figure 5:
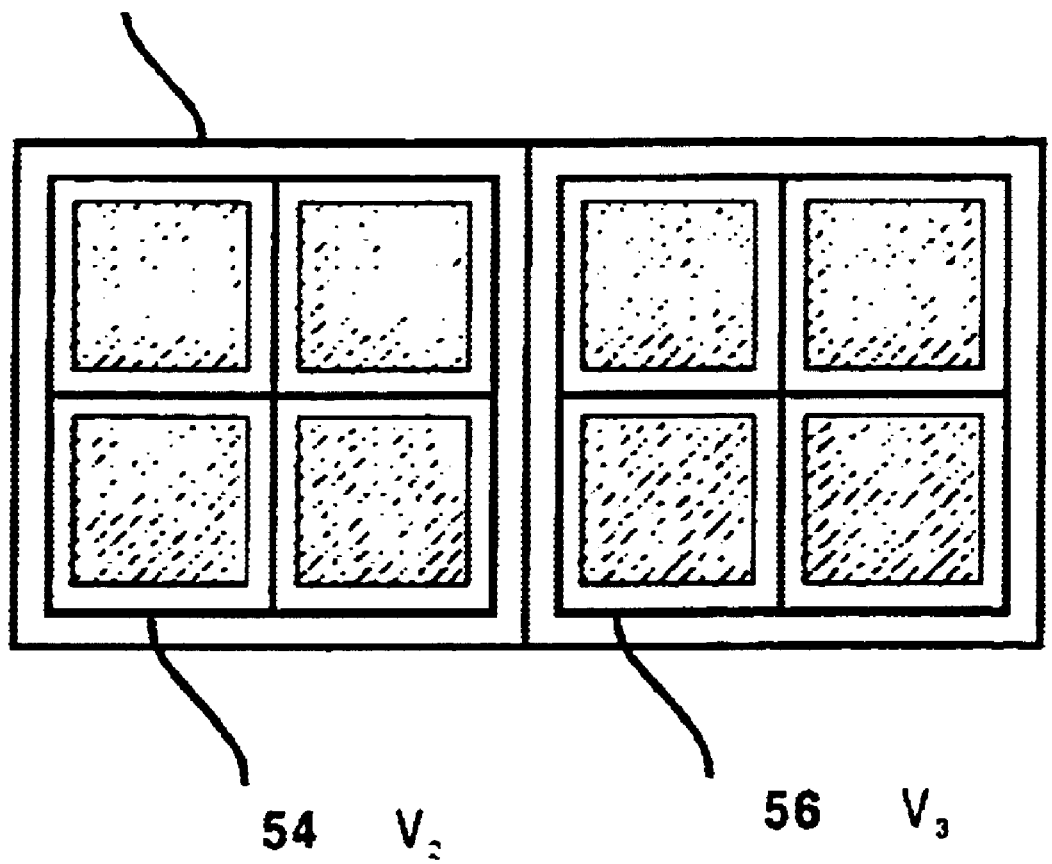
FIG. 5 is a top view illustrating the method for individually biasing the grid arrangements.

Referring now to FIG. 4, the individual interior grid arrangements 54 may be jointly biased by a single externally applied voltage using $V_2$ if the individual grids are coupled via a conductive bridge 60 placed over an electrical insulation layer 62 which electrically isolates the interior grid 54 from the exterior grid 52. This may be implemented as a part of planar silicon device fabrication using standard photolithography tools, or after the wafers have been processed on individual detectors using physical masks to define areas for insulator and metal evaporations. Referring now to FIG. 5, the interior grids such as 54 and 56 may be individually biased through external connections to each such grid using voltages $V_2$ 54, $V_3$ 56, and the like.

Figure 6:
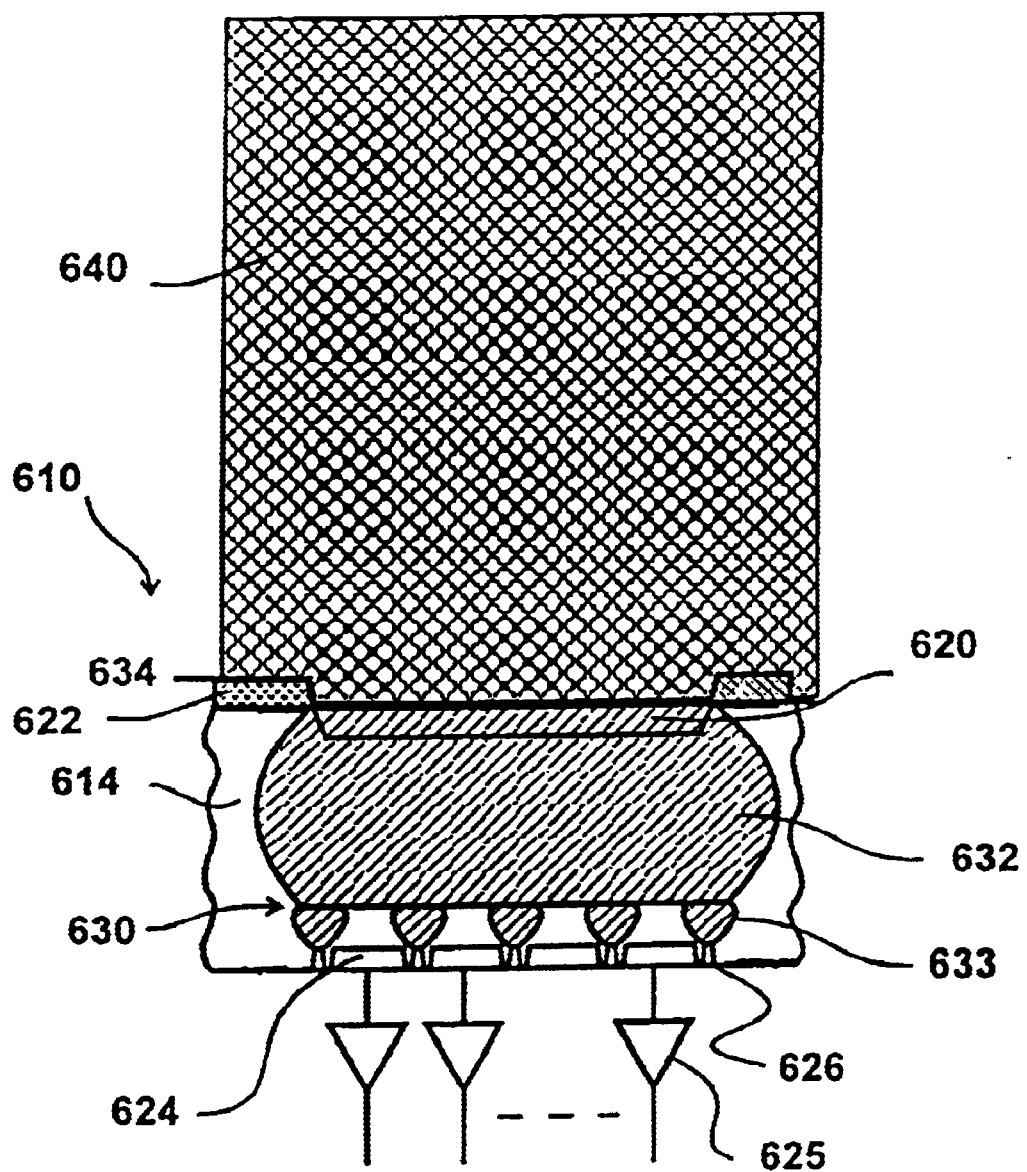
FIG. 6 is a cross-sectional view of a detector array coupled directly to scintillators and coupled with readout electronics in an exemplary embodiment according to the present invention.

The light sensitive array 10 in FIG. 1 of the present invention may be directly coupled to a scintillator. For example, FIG. 6 illustrates a light sensitive array 610, which has substantially identical structure as the light sensitive array 10. An entrance window 620 of the light sensitive array 610 is directly coupled to a scintillator 640, which may be selected from CsI(Tl), $CdWO_4$, NaI(Tl), LSO and BGO scintillators, or any other suitable scintillators.

Figure 7:
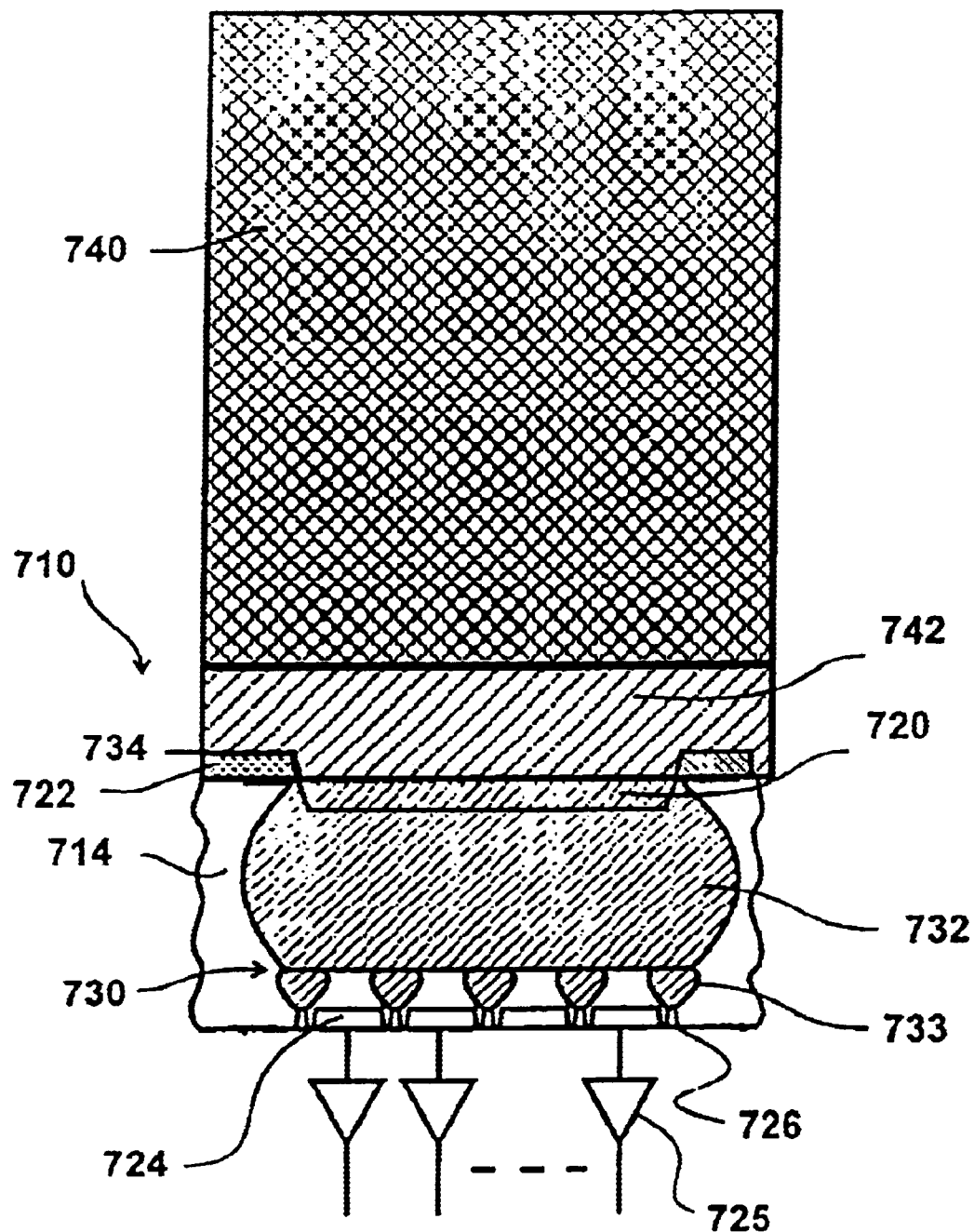
FIG. 7 is a cross-sectional view of a detector array coupled to scintillators via a interface that functions as a light guide and coupled with readout electronics in another exemplary embodiment according to the present invention.

In addition, the light sensitive array 10 of the present invention may be coupled to a scintillator via an interface that functions as a light guide between its entrance window and the scintillator. For example, FIG. 7 illustrates a light sensitive array 710, which has substantially identical structure as the light sensitive array 10. The light sensitive array 710 is coupled to a scintillator 740 via an interface 742 disposed between its entrance window 720 and the scintillator 740. The scintillator 740 may be selected from CsI(Tl), $CdWO_4$, NaI(Tl), LSO and BGO scintillators, or any other suitable scintillators.

Although the present invention has been described in certain specific embodiments, many additional modifications and variations would be apparent to those skilled in the art. It is therefore to be understood that the present invention may be practiced otherwise than as specifically described. Thus, the described embodiments of the present invention should be considered in all respects as illustrative and not restrictive, the scope of the invention to be determined by the appended claims and their equivalents.

We claim:

1. A detector array formed on a high resistivity semiconductor material having a first side and a second side, the detector array comprising:
   an entrance window formed on the first side, the entrance window being used to receive radiation; and
   an array of detectors formed on the second side, one or more of the detectors being used for detecting the radiation received via the entrance window,
   wherein the entrance window forms a junction with the high resistivity semiconductor material, and the detectors comprise pixelated ohmic contacts.

2. The detector array of claim 1, wherein one or more detectors are surrounded by one or more junction separation implants, the junction separation implants surrounding the detectors in a form of a grid or rings.

3. The detector array of claim 2, wherein the semiconductor material is high resistivity n-type silicon, the entrance window is p+ type, the array of detectors are n+ type, and the junction separation implants are p+ type.

4. The detector array of claim 2, wherein the semiconductor material is high resistivity p-type silicon, the entrance window is n+ type, the array of detectors are p+ type and the junction separation implants are n+ type.

5. The detector array of claim 1, wherein the entrance window is coupled to one selected from a group consisting of a scintillator, a scintillator array, a light guide or a diffuser for providing the radiation to the detector array via the entrance window.

6. The detector array of claim 1, wherein one or more detectors are coupled to readout electronics.

7. The detector array of claim 1, wherein the array of detectors comprise radiation hardened detectors, and is used to detect at least one radiation selected from a group consisting of particles, light, x-ray, and gamma-ray.

8. The detector array of claim 1, wherein both the entrance window and the junction separation implants are reverse biased, and the reverse biasing generates in the semiconductor material a first depletion region originating at the first side and a plurality of second depletion regions originating at the second side with a pinch off region formed between the first depletion region and at least one of the second depletion regions.

9. A detector array formed on a semiconductor material having a first side and a second side, the detector array comprising:
   an entrance window formed on the first side, the entrance window being used to receive radiation;
   an array of detectors formed on the second side, one or more of the detectors being used for detecting the radiation received via the entrance window; and
   a grid surrounding one or more detectors,
   wherein the entrance window forms a junction with the semiconductor material, and the detectors comprise pixelated ohmic contacts, and
   wherein the grid surrounding the detectors comprises an inner grid surrounding one or more detectors and an outer grid surrounding the inner grid, wherein a first pixel size is achieved by biasing the inner grid and a second pixel size is achieved by biasing the outer grid, wherein the second pixel size is larger than the first pixel size.

10. The detector array of claim 1, wherein the entrance window is coupled with a CsI(Tl) scintillator.

11. The detector array of claim 10, wherein the entrance window is directly coupled with the CsI(Tl) scintillator.

12. The detector array of claim 10, wherein the entrance window is coupled with the CsI(Tl) scintillator via an interface that functions as a light guide between the entrance window and the CsI(Tl) scintillator.

13. The detector array of claim 1, wherein the entrance window is coupled with one selected from a group consisting of $CdWO_4$, NaI(Tl), LSO and BGO scintillators.

14. The detector array of claim 1, wherein the entrance window is directly coupled with one selected from the group consisting of $CdWO_4$, NaI(Tl), LSO and BGO scintillators.

15. The detector array of claim 1, wherein the entrance window is coupled with one selected from a group consisting of $CdWO_4$, NaI(Tl), LSO and BGO scintillators via an interface that functions as a light guide between the entrance window and the selected one of the scintillators.

16. The detector array of claim 1, wherein the entrance window is optimized for receiving light from a CsI(Tl) scintillator.

17. The detector array of claim 1, wherein the entrance window is optimized for receiving light from one selected from a group consisting of $CdWO_4$, NaI(Tl), LSO, BGO scintillators.

18. The detector array of claim 1, wherein the high resistivity semiconductor material has a resistivity between 10 ohm-m to 200 ohm-m.

19. A method of forming a detector array on a high resistivity semiconductor material having a first side and a second side, the method comprising the steps of:
    forming an entrance window on the first side, the entrance window is for receiving radiation; and
    forming an array of detectors on the second side, one or more of the detectors are used for detecting the radiation received via the entrance window,
    wherein the entrance window forms a junction with the high resistivity semiconductor material, and the detectors comprise pixelated ohmic contacts.

20. The method of forming a detector array of claim 19, the method further comprising the step of:
    forming one or more junction separation implants, the junction separation implants surrounding the detectors in a form of a grid or rings.

21. The method of forming a detector array of claim 19, the method further comprising the step of:
    coupling the entrance window to one selected from a group consisting of a scintillator, a scintillator array, a light guide or a diffuser for providing the radiation to the detector array via the entrance window.

22. The method of forming a detector array of claim 19, the method further comprising the step of:
    coupling one or more detectors to readout electronics.

23. The method of forming a detector array of claim 19, the method further comprising the steps of:
    reverse biasing the entrance window; and
    reverse biasing the junction separation implants,
    wherein the reverse biasing generates a plurality of depletion regions in the semiconductor material with a pinch off region between at least one of the depletion regions located between the pinch off region and the first side and the rest of the depletion regions located between the pinch off region and the second side.

24. A method of forming a detector array on a semiconductor material having a first side and a second side, the method comprising the steps of:
    forming an entrance window on the first side, the entrance window is for receiving radiation;
    forming an array of detectors on the second side, one or more of the detectors are used for detecting the radiation received via the entrance window; and
    forming a grid that surrounds one or more detectors,
    wherein the entrance window forms a junction with the semiconductor material, and the detectors comprise pixelated ohmic contacts, and
    wherein the grid surrounding the detectors comprises an inner grid surrounding one or more detectors and an outer grid surrounding the inner grid, wherein a first pixel size is achieved by biasing the inner grid and a second pixel size is achieved by biasing the outer grid, wherein the second pixel size is larger than the first pixel size.

25. The method of claim 19, wherein the high resistivity semiconductor material has a resistivity between 10 ohm-m to 200 ohm-m.

26. A composite detector array comprising a plurality of detector arrays, wherein at least one of the detector arrays includes a detector array formed on a high resistivity semiconductor material having a first side and a second side, the detector array comprising:
    an entrance window formed on the first side, the entrance window being used to receive radiation; and
    an array of detectors formed on the second side, one or more of the detectors being used to detect the radiation received via the entrance window,
    wherein the entrance window forms a junction with the high resistivity semiconductor material, and the detectors comprise pixelated ohmic contacts.

27. The method of claim 26, wherein the high resistivity semiconductor material has a resistivity between 10 ohm-m to 200 ohm-m.

* * * * *